US007315995B2

(12) United States Patent
Nishiwaki

(10) Patent No.: US 7,315,995 B2
(45) Date of Patent: Jan. 1, 2008

(54) SEMICONDUCTOR INTEGRATED CIRCUIT DESIGNING METHOD AND PROGRAM

(75) Inventor: Akifumi Nishiwaki, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 339 days.

(21) Appl. No.: 11/072,493

(22) Filed: Mar. 7, 2005

(65) Prior Publication Data
US 2006/0117276 A1    Jun. 1, 2006

(30) Foreign Application Priority Data
Nov. 29, 2004  (JP) .............................. 2004-344097

(51) Int. Cl.
G06F 17/50 (2006.01)
(52) U.S. Cl. ................... 716/5; 716/2; 716/13; 716/10
(58) Field of Classification Search ................ 716/5, 716/2, 13, 10
See application file for complete search history.

(56) References Cited

U.S. PATENT DOCUMENTS

| 5,414,637 | A  | * | 5/1995  | Bertin et al. ................... 716/16 |
| 6,118,937 | A  | * | 9/2000  | Iwasaki ........................ 716/10 |
| 6,385,761 | B1 | * | 5/2002  | Breid ............................ 716/8 |
| 6,467,069 | B2 | * | 10/2002 | Mehrotra et al. .............. 716/6 |
| 7,127,694 | B2 | * | 10/2006 | Watanabe et al. .............. 716/9 |
| 7,216,325 | B2 | * | 5/2007  | Ohshige ....................... 716/12 |
| 2002/0078425 | A1 | * | 6/2002 | Mehrotra et al. .............. 716/6 |
| 2003/0177458 | A1 | * | 9/2003 | Beattie et al. ................. 716/4 |
| 2004/0049753 | A1 | * | 3/2004 | Kabuo ........................... 716/6 |
| 2005/0081176 | A1 | * | 4/2005 | Ohshige ....................... 716/13 |
| 2005/0108669 | A1 | * | 5/2005 | Shibuya ......................... 716/9 |
| 2005/0166176 | A1 | * | 7/2005 | Watanabe et al. ............. 716/21 |
| 2007/0011638 | A1 | * | 1/2007 | Watanabe et al. ............. 716/10 |

FOREIGN PATENT DOCUMENTS

| JP | 02-291148 | 11/1990 |
| JP | 05-063081 | 3/1993 |
| JP | 2004-172594 | 6/2004 |

OTHER PUBLICATIONS

Li e tal., "Routability-driven Placement and White Space Allocation", IEEE/ACM International Conference on Computer-Aided Design, Nov. 7-11, 2004, pp. 394-401.*

* cited by examiner

Primary Examiner—Phallaka Kik
(74) Attorney, Agent, or Firm—Arent Fox LLP

(57) ABSTRACT

An object of the present invention is to prevent occurrence of an unconnected terminal during arrangement and connection, shorten the time required for automatic arrangement and connection, improve a yield, and improve the properties of a cell. A recognized object-of-wiring thinning cell (minimum-rule cell) is temporarily replaced with a preferred-rule cell. Since a block has a free region devoid of a cell, an event that a replaced preferred-rule cell interferes with an adjoining one and is not separated from the adjoining one by a predetermined pitch will not take place. Even when the replaced cell interferes with the adjoining one, since the block has the free region devoid of a cell, the cell can be moved to a position at which it will not interfere with the adjoining one. An event that the cell is not separated from the adjoining one by the predetermined pitch will not take place. When all object-of-wiring thinning cells have been treated, reconnection is performed. When processing is terminated, a region of the block is modified.

3 Claims, 14 Drawing Sheets

SCHEMATIC DIAGRAM OF A MINIMUM-RULE CELL MC AND A PREFERRED-RULE CELL PC

↔ →←  DESIGNING-RULE SPACING DRC
↔  POLYSILICON-DIFFUSION REGION SPACING PDC

RULES FOR DESIGNING LOOSENED

FLOWCHART OF A DESIGNING METHOD IN A FIRST EMBODIMENT

SCHEMATIC DIAGRAM OF A BLOCK ACCORDING TO A FIRST EMBODIMENT
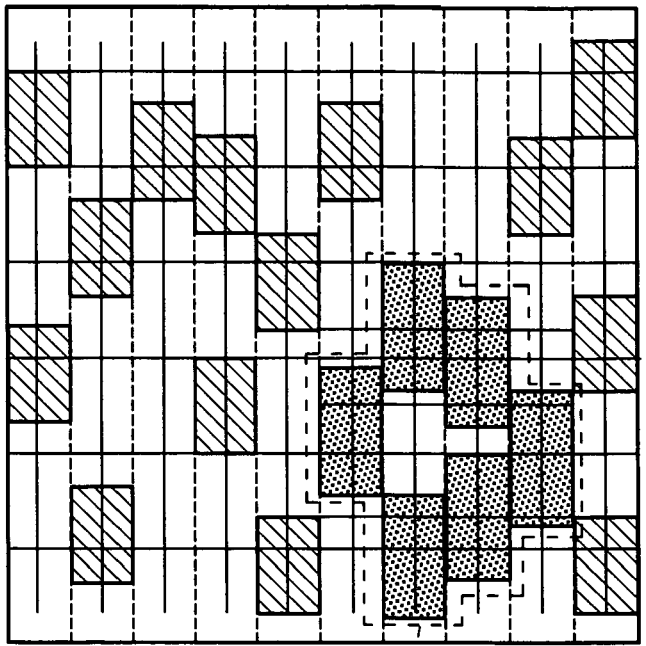
FIG. 3A
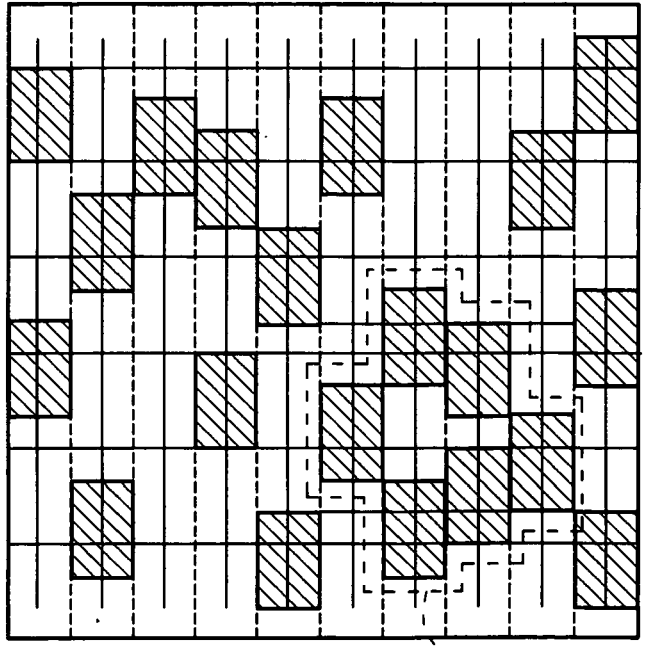
FIG. 3B

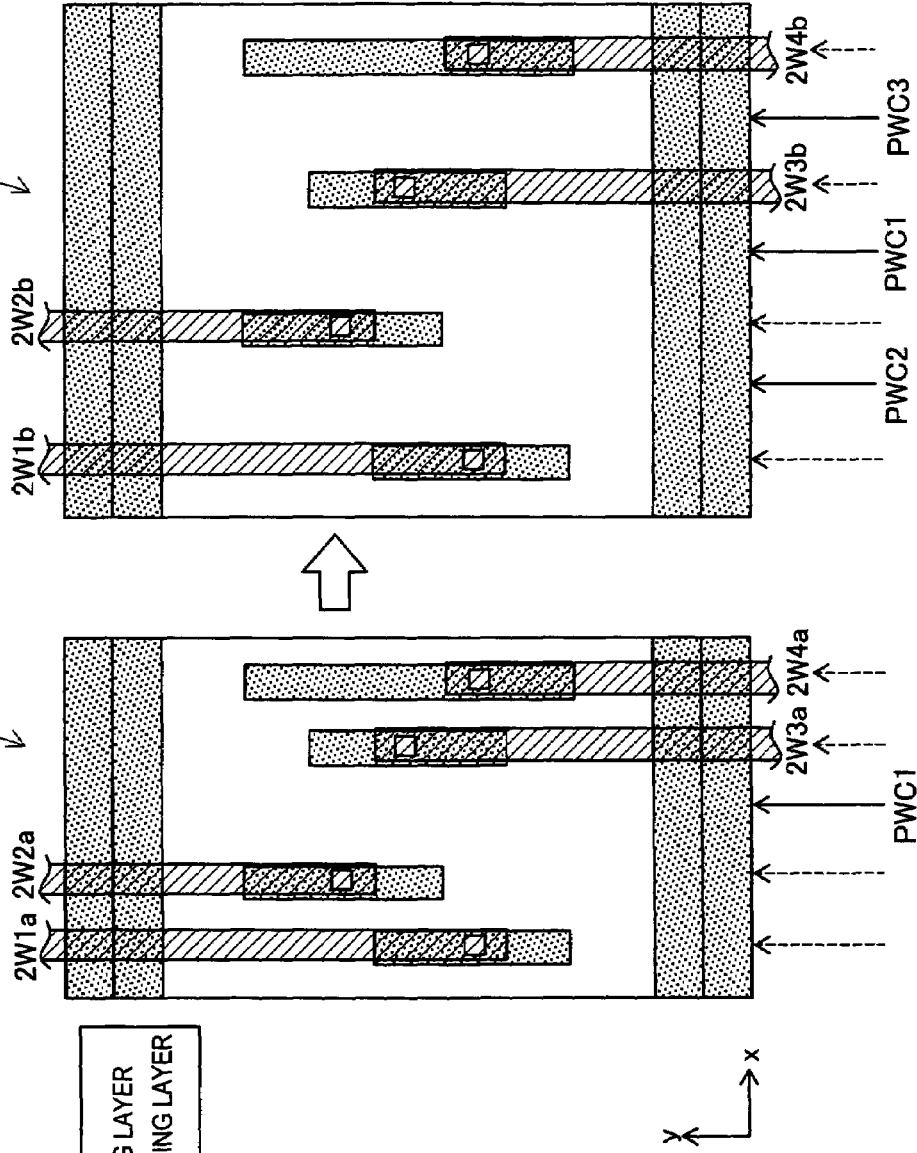

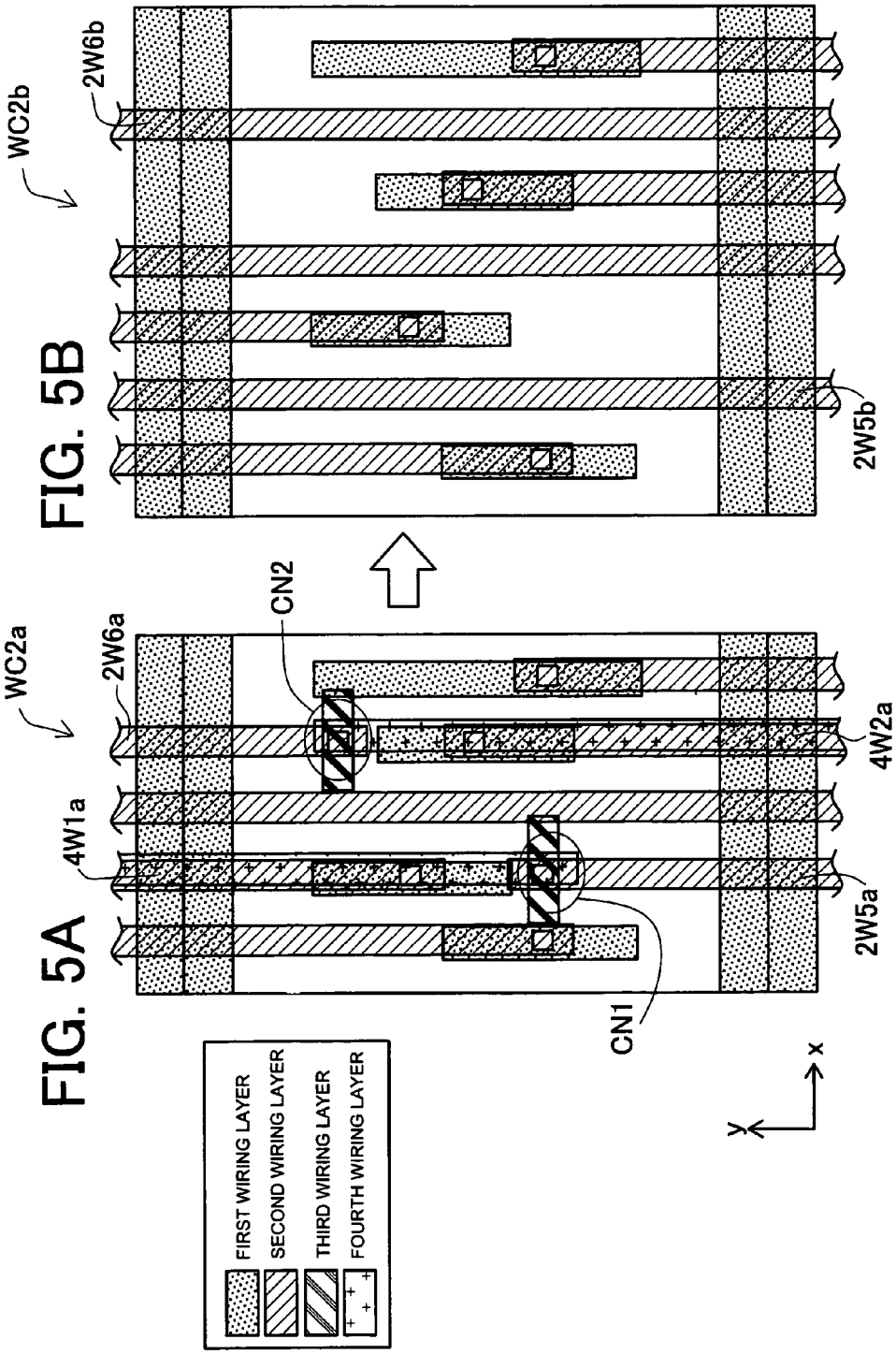

FLOWCHART OF A DESIGNING METHOD IN ACCORDANCE WITH A SECOND EMBODIMENT

SCHEMATIC DIAGRAM OF A BLOCK ACCORDING TO A SECOND EMBODIMENT

MINIMUM-RULE CELL MC     PREFERRED-RULE CELL PC

A FLOWCHART OF A DESIGNING METHOD ACCORDING TO A THIRD EMBODIMENT

FIG. 9
SCHEMATIC DIAGRAM OF A BLOCK ACCORDING TO A THIRD EMBODIMENT
 MINIMUM-RULE CELL  MC     PREFERRED-RULE CELL  PC
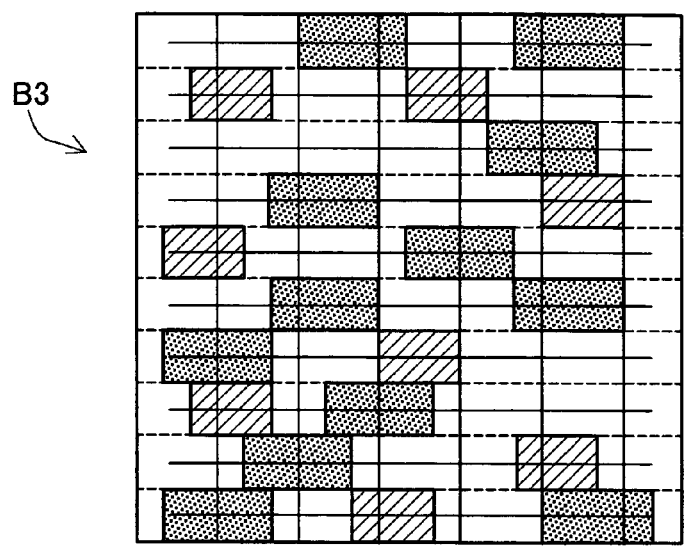

SCHEMATIC DIAGRAM OF A BLOCK ACCORDING TO A FOURTH EMBODIMENT

FLOWCHART OF DESIGNING METHOD ACCORDING TO A FIFTH EMBODIMENT

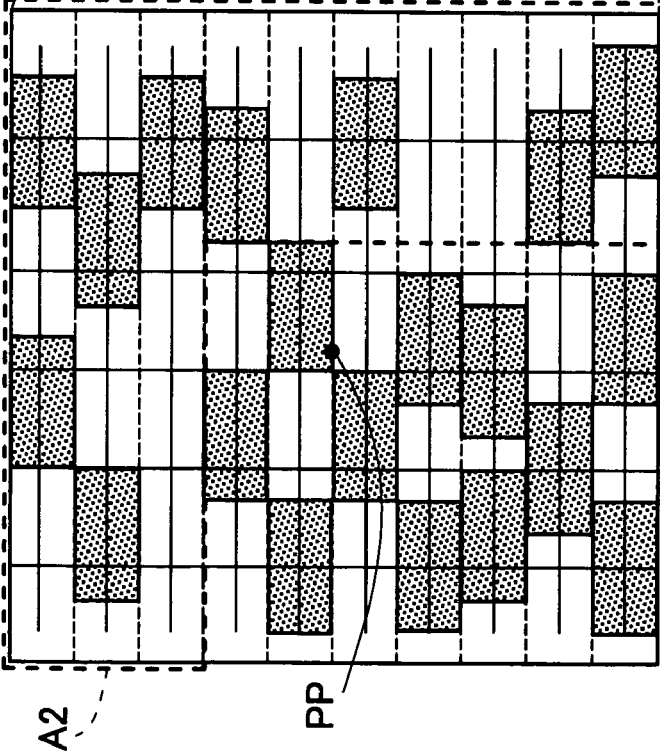
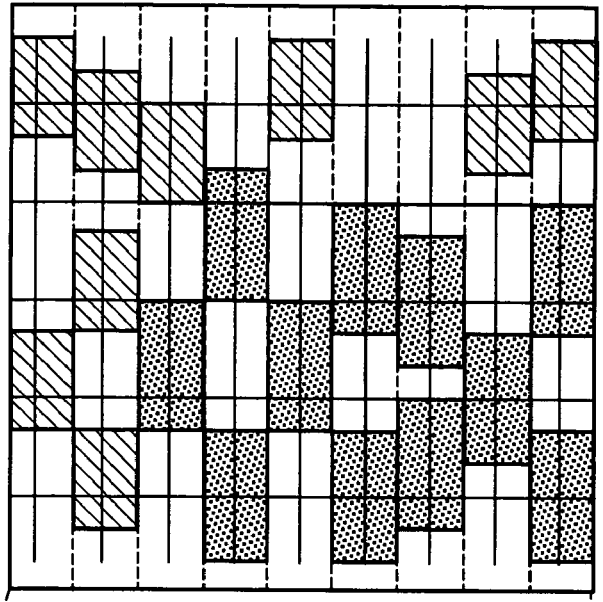
FIG. 13A / FIG. 13B
SCHEMATIC DIAGRAM OF A BLOCK TREATED ACCORDING TO THE FIFTH EMBODIMENT
MINIMUM-RULE CELL MC
PREFERRED-RULE CELL PC

AN EXAMPLE OF A STANDARD CELL ACCORDING TO RELATED ART (PART1)

AN EXAMPLE OF A STANDARD CELL ACCORDING TO RELATED ART (PART2)

SEMICONDUCTOR INTEGRATED CIRCUIT DESIGNING METHOD AND PROGRAM

This application is based upon and claims the benefit of priority from the prior Japanese Patent Application No. 2004-344097 filed on Nov. 29, 2004, the entire contents of which are incorporated herein by reference.

BACKGROUND OF THE INVENTION

1. Field of the Invention

The present invention relates to a semiconductor integrated circuit designing method and program. More particularly, the present invention is concerned with a semiconductor integrated circuit designing method and program that implement automatic arrangement and connection according to a standard cell technique or the like.

2. Description of Related Art

FIG. 14A shows an example of a standard cell contained in a cell library A, and FIG. 14B shows an example of a standard cell contained in a cell library B. Hatched areas 121 in FIG. 14A and FIG. 14B indicate a first-layer Al line, and blank areas 122 therein indicate a second-layer Al line. FIG. 14A and FIG. 14B are identical to each other in terms of positions and names of terminals and outer dimensions of a cell. However, the Al layers used for electrodes or terminals in the cell shown in FIG. 14A are reverse to those in the cell shown in FIG. 14B. The cell libraries A and B are registered in a computer in advance. Cells to be arranged and interconnected in a block are selected from, for example, the library A. After the thus completed block is disposed, when the block is turned 90°, the library used to complete the block, or, the Al layer used for wiring is changed to the other one through computer-aided design (CAD). This process is much simpler than automatic connection. After the direction of the Al layer used for wiring is matched with the direction of Al layers in the other blocks, the blocks are interconnected.

As related arts, Japanese Unexamined Patent Application Publications Nos. 2-291148 and 2004-172594 have been disclosed.

SUMMARY OF THE INVENTION

According to the foregoing related art, wirings of blocks whose directions are different from each other can be prevented from interfering with each other. Congestion of numerous wirings that are oriented in the same direction cannot be resolved. This poses a problem in that the time (TAT) required for automatic arrangement and connection cannot be shortened. Moreover, since how to loosen rules for designing a cell is not described at all, a yield cannot be improved by loosening the rules for designing. Moreover, since a pitch between adjoining lines is not described at all, a signal transmission speed cannot be improved by reducing a wiring capacitance.

The present invention attempts to solve at least one of the problems underlying the background arts. An object of the present invention is to provide a semiconductor integrated circuit designing method and program capable of preventing production of an unconnected terminal during arrangement and connection, shortening the time required for automatic arrangement and connection, improving a yield by minimizing the dispersion of transistors so as to increase a manufacturing margin, and improving the properties of a cell by reducing a wiring capacitance so as to increase a signal transmission speed.

In order to accomplish the above object, the first idea relevant to the present invention provides a designing method employing a first cell library that contains a plurality of standard cells, and a second cell library that contains cells which, unlike the cells that are contained in the first cell library and share the same circuitry, include numerous channels and have rules for designing loosened. The designing method comprises: a step of arranging and interconnecting cells selected from the first cell library; a step of calculating a wiring density, that is, the ratio of an area occupied by wiring to the area of each of the first cells selected from the first cell library and arranged and interconnected, and regarding a first cell as an object-of-wiring thinning cell according to the wiring density; a step of replacing the object-of-wiring thinning cell with a second cell selected from the second cell library so that the object-of-wiring thinning cell will be separated from an adjoining cell by a predetermined pitch; and a step of performing reconnection.

The first cell library contains a plurality of standard cells. The second cell library contains cells that, unlike the cells that are contained in the first cell library and share the same circuitry, include numerous channels and have rules for designing loosened. At the step of arranging and interconnecting cells selected from the first cell library, cells equivalent to circuits to be designed are selected from the first cell library, and then arranged and interconnected. At the step of regarding as an object-of-wiring thinning cell any of the first cells selected from the first cell library and arranged and interconnected, the wiring density of each of the first cells is calculated and a first cell is regarded as the object-of-wiring thinning cell according to the wiring density. A method of recognizing the object-of-wiring thinning cell is, for example, a method of comparing the wiring density with a predetermined value. When the wiring density of a cell is higher, the cell is recognized as the object-of-wiring thinning cell. What is referred to as the wiring density is the ratio of an area occupied by wiring to the area of a first cell and is an example of a concept expressing a degree of congestion of wiring.

At the step of replacing the object-of-wiring thinning cell with a second cell selected from the second cell library, the object-of-wiring thinning cell must be separated from an adjoining cell by a predetermined pitch. When the object-of-wiring thinning cell is not separated from an adjoining cell by the predetermined pitch, the step of replacing the object-of-wiring thinning cell with the second cell is not performed. The predetermined pitch refers to a minimum spacing between adjoining cells stipulated as one of rules for designing. At the step of performing reconnection, cells are reconnected to the other cells. At this time, only cells that have been replaced or moved may be reconnected to the other cells or all cells may be re-interconnected.

Consequently, the object-of-wiring thinning cell is replaced with a second cell so that it will be separated from an adjoining cell by the predetermined pitch. Thus, the number of bypasses included in multilayer wiring of the object-of-wiring thinning cell or the number of contacts included therein is decreased. Consequently, the congestion of wiring is alleviated. The time required for calculation performed during automatic arrangement and connection can be shortened, and the number of times by which arrangement and connection is resumed can be decreased. Consequently, the total time required for automatic arrangement and connection can be shortened. Moreover, the rules for designing the object-of-wiring thinning cell can be loosened. Consequently, the dispersion of transistors can be minimized, a manufacturing margin can be increased, and a yield can be improved. Moreover, since a spacing between lines can be expanded, a wiring capacitance decreases and a signal transmission speed increases. This contributes to improvement in the properties of a cell.

The second idea relevant to the present invention provides a designing method employing a first cell library that contains a plurality of standard cells, and a second cell library that contains cells which, unlike the cells that are contained in the first cell library and share the same circuitry, include numerous channels and have rules for designing loosened. The designing method comprises: a step of arranging and interconnecting cells selected from the second cell library; a step of regarding as an object-of-movement cell a second cell that is selected from the second cell library and arranged and connected to the other cells and that includes an unconnected terminal, or/and an obstacle cell that hinders connection between terminals which should be connected to each other; a step of moving the object-of-movement cell in the state of a second cell so that it will be separated from an adjoining cell by a predetermined pitch; and a step of performing reconnection.

At the step of arranging and interconnecting cells, cells are selected from the second cell library. At the step of recognizing an object-of-movement cell, at least one of a second cell that includes an unconnected terminal and an obstacle cell that hinders connection between terminals which should be connected to each other is regarded as the object-of-movement cell. The step of moving the object-of-movement cell in the state of the second cells is achieved so that the object-of-movement cell will be separated from an adjoining cell by the predetermined pitch. At the step of performing reconnection, reconnection is performed.

Consequently, cells including respective terminals that should be connected to each other are moved to approach each other or moved towards a region in which wiring is not congested. Thus, a channel is reserved in order to resolve an unconnected state. Moreover, an obstacle cell that hinders connection between terminals which should be connected to each other is moved in order to reserve a channel, whereby the unconnected state is resolved. Moreover, after a second cell is moved, when the second cell is not separated from an adjoining cell by a predetermined pitch, the second cell is replaced with a first cell whose area is smaller. Consequently, the first cell is separated from the adjoining cell by the predetermined pitch.

Moreover, while production of an unconnected terminal is prevented, the number of second cells arranged within a block can be maximized. As the ratio of the number of second cells gets larger, the dispersion of transistors is reduced because the rules for designing a cell are loosened. Consequently, a yield improves. Moreover, the number of bypasses included in multilayer wiring decreases, and the total time required for automatic arrangement and connection is shortened. Consequently, the improvement of the yield and the reduction in the total time required for automatic arrangement and connection are maximized.

The third idea relevant to the present invention provides a designing method employing a first cell library that contains a plurality of standard cells, and a second cell library that contains cells which, unlike cells contained in the first cell library and sharing the same circuitry, include numerous channels and to have rules for designing loosened. The designing method comprises: a step of calculating a target cell use rate, that is, the ratio of the total area of first cells, which are selected from the first cell library and arranged in a minimum block, to the area of the minimum block determined based on a netlist and the number of wiring layers; a step of detecting an actual-use block that is larger in size than the minimum block; and a step of calculating a cell ratio, that is, the ratio of the number of first cells, which are selected from the first cell library and arranged and interconnected in the actual-use block, to the number of second cells that are selected from the second cell library and arranged and interconnected in the actual-use block.

At the step of calculating the target cell use rate, the area of the minimum block and the total area of first cells selected from the first cell library and arranged in the smallest block are calculated based on a netlist and the number of wiring layers. The ratio of the total area of first cells to the area of the minimum block is calculated as the target cell use rate. At the step of detecting an actual-use block, an actual-use block that is larger in size than the minimum block is detected depending on a degree of convergence of automatic arrangement and connection. What is referred to as a cell ratio is the ratio of the number of first cells to the number of second cells and determined so that the cell ratio will meet the target cell use rate. Namely, the ratio of the total area of first cells to the area of the actual-use block (which will be referred to as an actual cell use rate) is lower than the ratio of the total area of first cells to the area of the minimum block (target cell use rate). A predetermined number of first cells within the actual-use block is replaced with second cells, whereby the actual cell use rate is raised to the target cell use rate. The predetermined number of first cells is determined with the cell ratio.

Consequently, the cell ratio can be optimized so that calculation employed in automatic arrangement and connection will reliably converge with the freedom in moving cells ensured, an unconnected state will not occur, and the number of second cells will be maximized by making the most of a free region devoid of a cell. The target cell use rate is used as an index for optimizing the cell ratio, and the cell ratio is determined to meet the target cell use rate. The cell ratio can thus be optimized quickly and readily. By optimizing the cell ratio, while occurrence of an unconnected state is prevented, improvement of a yield attributable to the fact that the rules for designing are loosened because of the use of second cells, and reduction in the total time required for automatic arrangement and connection can be maximized.

The fourth idea relevant to the present invention provides a designing method employing a first cell library that contains a plurality of standard cells, and a second cell library that contains cells which, unlike the cells that are contained in the first cell library and share the same circuitry, include numerous channels and have rules for designing loosened. The designing method comprises: a step of arranging and interconnecting first cells selected from the first cell library; a step of detecting a critical path, which is a channel whose margin is so small as to cause a signal delay, by referencing a netlist; a step of recognizing a first cell, which is one of all the first cells arranged and interconnected and through which the critical path passes, as an object-of-replacement cell; a step of replacing the object-of-replacement cell with a second cell, which is selected from the second cell library, so that the object-of-replacement cell will be separated from an adjoining cell by a predetermined pitch; and a step of performing reconnection.

The first cells are selected from the first cell library and arranged and interconnected. The critical path that is a channel whose margin is so small as to cause a signal delay is detected based on a netlist. A first cell through which the critical path passes is recognized as an object-of-replacement cell. The object-of-replacement cell is replaced with a second cell so that it will be separated from an adjoining cell by a predetermined pitch. At the step of performing reconnection, reconnection is performed.

Consequently, since the cell through which the critical path passes is replaced with the second cell, the spacing between adjoining lines is expanded. Eventually, a wiring capacitance decreases, and a signal transmission speed offered by the critical path increases. Thus, the signal delay is prevented. Moreover, since the number of bypasses included in the critical path decreases, the signal delay attributable to a contact resistance is prevented. A margin required to prevent a signal delay can be ensured.

The fifth ideal relevant to the present invention provides a designing method employing a first cell library that contains a plurality of standard cells, and a second cell library that contains cells which, unlike cells that are contained in the first cell library and share the same circuitry, include numerous channels and have rules for designing loosened. The designing method comprises: a step of calculating a second cell wiring density, that is, the ratio of an area occupied by wiring to the area of each of second cells that are selected from the second cell library and arranged and interconnected in a block, and recognizing as object-of-contraction cells second cells whose second cell wiring densities are equal to or smaller than a predetermined value; a step of replacing the object-of-contraction cells with first cells selected from the first cell library, and moving the first cells or/and second cells, which are arranged and interconnected in the block, towards the center of the block; a step of performing reconnection, and a step of reconfiguring the block.

The second cells whose second cell wiring densities are equal to or smaller than the predetermined value are recognized as object-of-contraction cells. The object-of-contraction cells are replaced with first cells. The first cells or/and second cells arranged and interconnected within a block are moved towards the center of the block. At the step of performing reconnection, reconnection is performed. Thereafter, the block is reconfigured.

Consequently, a second cell whose second cell wiring density is low and whose wiring has room is selectively replaced with a first cell. Congestion of wiring derived from replacement with a first cell is prevented. Degradation of a yield attributable to an increase in the time required for automatic arrangement and connection and an increase in the number of bypasses can be prevented. A block size can be reduced. Eventually, while the performance of a semiconductor device and the time required for automatic arrangement and connection are held unchanged, a chip size can be reduced. The cost of a semiconductor device can be lowered.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 3A and FIG. 3B schematically show a block treated according to the first embodiment;

FIG. 4A and FIG. 4B schematically show an object-of-wiring thinning cell WC that includes no bypass;

FIG. 5A and FIG. 5B schematically show an object-of-wiring thinning cell WC that includes bypasses;

FIG. 9 schematically shows a block treated according to the third embodiment;

FIG. 13A and FIG. 13B schematically show a block treated according to the fifth embodiment;

DETAILED DESCRIPTION OF THE PREFERRED EMBODIMENTS

Referring to FIG. 1 to FIG. 13, embodiments of the present invention to be adapted to a semiconductor memory device will be described below. A first embodiment of the present invention will be described in conjunction with FIG. 1A to FIG. 5B.

A semiconductor integrated-circuit device that is a product available in a small lot and in diverse types is requested to be developed for a short period of time and is therefore often designed by an automatic arrangement/connection system including a computer. Among various automatic arrangement/connection methods that are known, a standard cell method is often adopted. According to the standard cell method, the patterns of basic gates or logical circuits whose use frequencies are high are registered as standard cells in a cell library. Based on a netlist concerning a semiconductor integrated-circuit device to be manufactured, the standard cells are arranged and interconnected. Thus, automatic arrangement and designing are completed. The cells have a wiring region in which wiring is patterned, and multilayer wiring is adopted as the wiring. A mask is produced based on the arrangement and the wiring patterns, whereby an integrated circuit is produced.

Figure 1A:
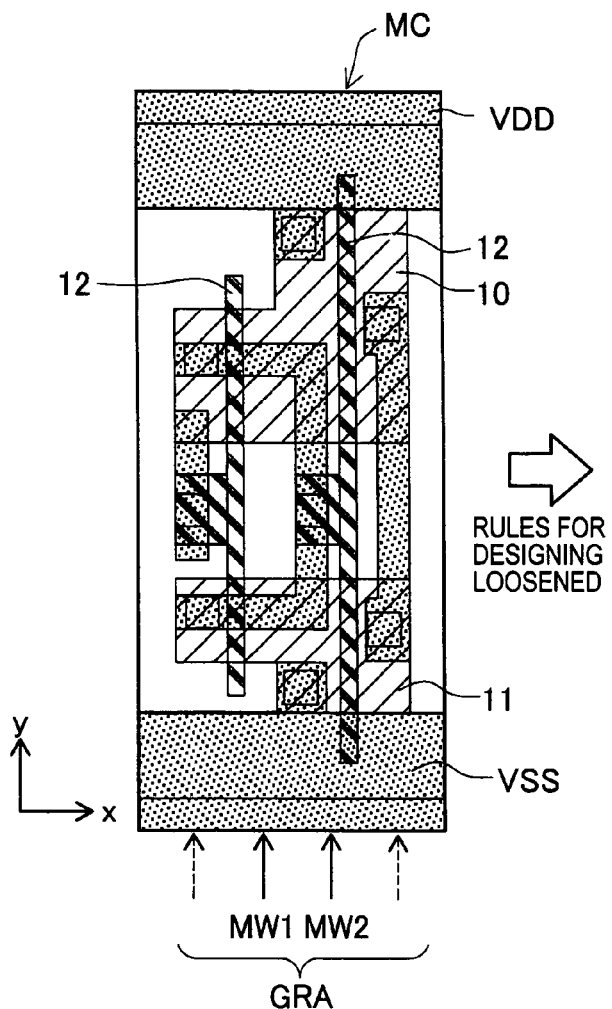
FIG. 1A and FIG. 1B schematically show a minimum-rule cell MC and a preferred-rule cell PC.
Figure 1B:
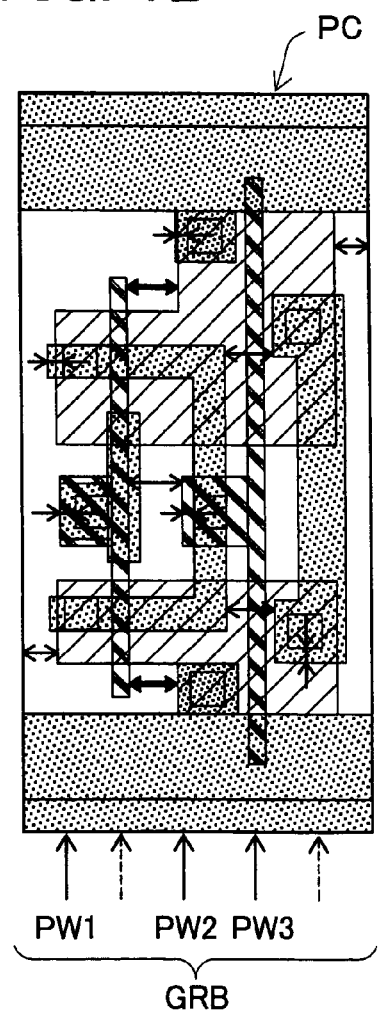

According to the present invention, two kinds of cells, that is, a minimum-rule cell MC (FIG. 1A) and a preferred-rule cell PC (FIG. 1B) are used as standard cells sharing the same circuitry. The minimum-rule cell MC and preferred-rule cell PC are registered in a minimum-rule cell library MCL and a preferred-rule cell library PCL respectively. The structure of a cell will be described. FIG. 1A shows a cell disposed on a semiconductor substrate and an example of a shape-fixed wiring region in the cell. Referring to FIG. 1A, the cell MC has diffusion regions 10 and 11. The diffusion regions 10 and 11 are surrounded by an isolation region made of a silicon oxide or the like. A polysilicon wiring layer 12 used to form gates of MOS transistors is formed over the diffusion regions and isolation region. A plurality of metallic wiring layers are formed above the polysilicon wiring layer 12. In FIG. 1A and FIG. 1B, a first wiring layer MET1 is formed. Wiring is contained not only in the first wiring layer MET1 but also in the upper layers, but the upper layers are not shown. The multiple wiring layers are formed using metallic lines made of Al or Cu, and include, for example, three to eight layers. In the present embodiment, the first wiring layer MET1 is extended in x and y directions in FIG. 1A and FIG. 1B. The second wiring layer MET2 and fourth wiring layer MET4 are extended in the y direction, and the third wiring layer MET3 is extended in the x direction. The first wiring layer MET1 contains power lines VDD and VSS extended in horizontal directions in the drawing. Nodes (contacts) between each of the metallic wiring layers and the diffusion region or lower wiring are indicated with squares.

The second wiring layer MET2 that is not shown is used to form lines that intersect the power lines (line extending in the y direction in FIG. 1A). A place in the second wiring layer MET2 where a line can be formed shall be called a grid. FIG. 1A shows grids GRA, and FIG. 1B shows grids GRB. The minimum-rule cell MC shown in FIG. 1A is a cell designed under minimum rules stipulated according to a process technology. In contrast, the preferred-rule cell PC shown in FIG. 1B is a cell designed under rules that are looser than the rules under which the minimum-rule cell MC is designed. The preferred-rule cell PC is wider by one grid in the x direction (lateral direction in the sheet of the drawing) than the minimum-rule cell MC. Namely, since the minimum-rule cell MC has four grids GRA juxtaposed in the x direction, four lines can be formed in the second wiring layer MET2 of the minimum-rule cell MC so that they will extend in the y direction. In contrast, since the preferred-rule cell PC has five grids GRB juxtaposed, five lines can be formed in the second wiring layer MET2 thereof so that they will extend in the y direction. Among the grids, grids which have neither an input terminal nor an output terminal and along which a line can pass through the cell shall be defined as passing line channels. The minimum-rule cell MC has two passing line channels MW1 and MW2. The preferred-rule cell PC shown in FIG. 1B has five grids juxtaposed in the x direction, and three of the five grids are passing line channels PW1, PW2, and PW3.

Figure 2:
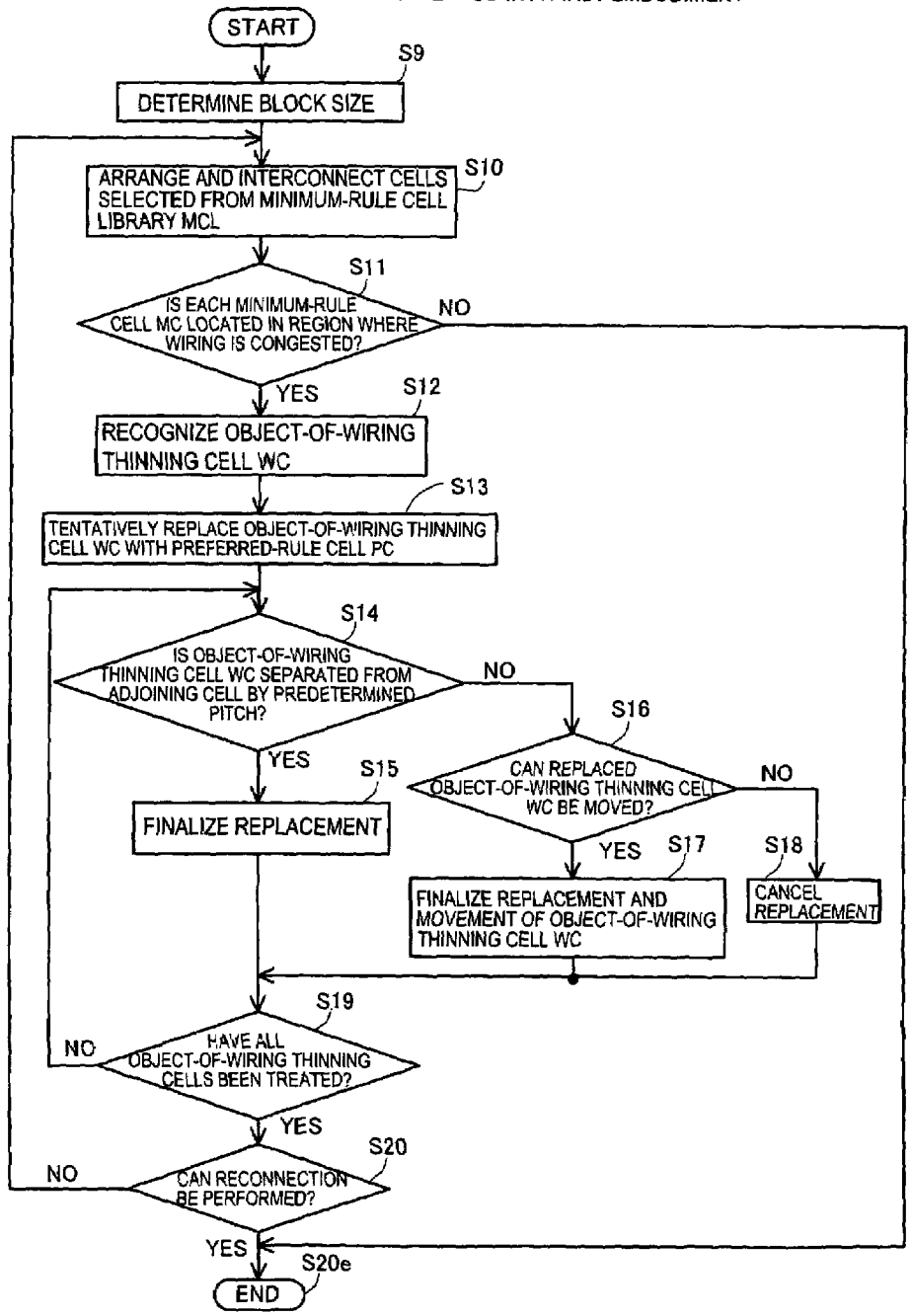
FIG. 2 is a flowchart describing a designing method in accordance with a first embodiment.

FIG. 2 is a flowchart describing the first embodiment. The first embodiment selects a minimum-rule cell MC located in a region in which wiring is congested, and replaces it with a preferred-rule cell PC. At step 9, a block size is determined based on a netlist resulting from logical synthesis. The block size should preferably be a minimum size permitting arrangement and connection of cells selected based on the netlist. An overall length of wiring is calculated based on circuit information such as the number of cells, the number of nets, and an average fan-out that are specified in the netlist. Herein, the fan-out refers to the number of cells interconnected over a certain net. The average fan-out refers to an average of the fan-outs relevant to all nets. Moreover, the number of wiring layers employed is predetermined based on the specifications for a semiconductor integrated circuit or the cost of a chip. Based on the overall length of wiring and the number of wiring layers, the size of a minimum block MB accommodating the overall length of wiring is determined. However, when the minimum block MB is used to arrange and interconnect cells, a wiring region has no room. Calculation employed in automatic arrangement and connection that is a trial-and-error process hardly converges and the time required for the automatic arrangement and connection extends. Consequently, an actual-use block UB that is larger by a predetermined dimension from the minimum block MB is employed. The predetermined dimension is set to a value confining the time required for the automatic arrangement and connection to a predetermined time according to a process technology or a netlist.

Thereafter, automatic arrangement and connection is initiated at step 10. Cells are selected from the minimum-rule cell library MCL and then arranged and interconnected. At this time, cells are selected from the minimum-rule cell library MCL according to the net list, arranged in the block, and then interconnected. FIG. 3A illustratively shows a block B1a observed immediately after the completion of the arrangement and connection. Solid lines in FIG. 3A showing the block B1a indicate wirings. Herein, the ratio of the sum total of the areas of all minimum-rule cells MC to the area of the block B1a shall be defined as a cell use rate. As shown in FIG. 3A, the cell use rate of the minimum-rule cells MC to the block B1a is not 100%. Although the block has a room for arrangement of cells, when the wiring in an upper layer is congested and saturated, the number of cells that can be arranged is limited by the wiring in the upper layer. As described later, a feature of the present invention is that a free region in the block B1a which is devoid of a cell is effectively utilized.

Thereafter, at step 11, each of the minimum-rule cells MC in the block B1a is checked to see whether it has a region in which wiring is congested. Whether wiring is congested is verified using a tool, for example, a congestion map. Congestion of wiring is verified according to various methods. According to a method employed in the present embodiment, a wiring density that is the ratio of an area occupied by wiring to the area of a minimum-rule cell MC is calculated. When the wiring density is equal to or larger than a predetermined value, wiring is verified to be congested.

When the wiring density is equal to or larger than a value predetermined based on a process technology or the specifications for a semiconductor integrated circuit to be designed, wiring is verified to be congested. Control is then passed to step 12. When the wiring density is smaller than the predetermined value, wiring is verified not to be congested. Control is then passed to step 20e. Processing is terminated. In the block B1a (FIG. 3A), a region A1a is selected as a region where wiring is congested.

At step 12, a minimum-rule cell MC whose wiring is congested is recognized as an object-of-wiring thinning cell WC. In the block B1a, the minimum-rule cells MC located in the region A1a are regarded as minimum-rule cells MC whose wirings are congested, and the minimum-rule cells MS are regarded as the object-of-wiring thinning cells WC. FIG. 4A to FIG. 5B show examples of minimum-rule cells MC regarded as object-of-wiring thinning cells WC. For a better understanding, FIG. 4A to FIG. 5B show the first wiring layer MET1 and second wiring layer MET2 alone but do not show the underlying layers. FIG. 4A shows an example (of an object-of-wiring thinning cell WC1a) in which lines serving as bypasses are not included. FIG. 5A shows an example (of an object-of-wiring thinning cell WC2a) in which lines serving as bypasses are included. In FIG. 4A, the cell includes one passing line channel (PWC1). The wiring density of the wiring including lines 2W1a to 2W4a formed in the second wiring layer MET2 to the area of the object-of-wiring thinning cell WC1a is high. In FIG. 5A, the second wiring layer MET2 of the object-of-wiring thinning cell WC2a has no available passing line channel. A line 2W5a in the second wiring layer MET2 is bypassed to a line 4W1a in the fourth wiring layer MET4 by way of the third wiring layer MET3 via a contact CN1. Likewise, a line 2W6a is bypassed to a line 4W2a by way of the third wiring layer MET3 via a contact CN2. The wiring density in FIG. 5A is higher than that in FIG. 4A.

Thereafter, control is passed to step 13. The recognized object-of-wiring thinning cell WC (minimum-rule cell MC) is temporarily replaced with a preferred-rule cell PC selected from the preferred-rule cell library PCL. The replacement will be described. When the replacement is performed, a cell area is increased in the x direction from the area shown in FIG. 1A to the area shown in FIG. 1B. However, as shown in FIG. 3A, the block B1a has a free space devoid of a cell. The replaced preferred-rule cell PC will not interfere with an adjoining one. Namely, the event that the preferred-rule cell PC is not separated from an adjoining one by a predetermined pitch can be prevented. Moreover, even when the replaced preferred-rule cell PC interferes with an adjoining one, since the block has a free space devoid of a cell, the preferred-rule cell PC can be moved to a position at which it will not interfere with an adjoining one. Herein, the event that the preferred-rule cell PC is not separated from an adjoining one by the predetermined pitch can be prevented. Herein, the predetermined pitch refers to a minimum spacing between cells stipulated as one of rules for designing.

After temporal replacement is completed, control is passed to step 14. The replaced object-of-wiring thinning cell WC is checked to see whether it is separated from an adjoining cell by the predetermined pitch. When the object-of-wiring thinning cell WC is separated from the adjoining cell by the predetermined pitch, control is passed to step 15. The replacement with the preferred-rule cell PC is finalized, and control is passed to step 19. When the object-of-wiring thinning cell WC is not separated from the adjoining cell by the predetermined pitch, control is passed to step 16.

At step 16, the replaced object-of-wiring thinning cell WC is checked to see whether it can be moved to be separated from the adjoining cell by the predetermined pitch. When the object-of-wiring thinning cell WC is separated from the adjoining cell by the predetermined pitch, control is passed to step 17. The replacement of the object-of-wiring thinning cell with the preferred-rule cell PC and the movement thereof are finalized, and control is passed to step 19. On the other hand, when the object-of-wiring thinning cell WC is not separated from the adjoining cell by the predetermined pitch, control is passed to step 18. The temporal replacement is canceled, and the minimum-rule cell MC that is not replaced with the preferred-rule cell is adopted. Control is then passed to step 19.

At step S19, whether all the object-of-wiring thinning cells WC are checked at steps 14 and 16 is verified. When any object-of-wiring thinning cell WC is not checked at the steps, control is returned to step 14. The foregoing processing is repeated until an object-of-wiring thinning cell WC that has not yet been checked runs out. When all the object-of-wiring thinning cells WC are treated, control is passed to step 20. Reconnection is performed. When reconnection included in automatic arrangement and connection does not converge within a certain time, the reconnection is disabled. Moreover, reconnection may be performed only on the replaced and moved cell or may be performed on all cells. When reconnection cannot be performed, control is returned to step 10 and arrangement and connection is resumed from the beginning. When reconnection can be performed, control is passed to step 20e. Processing is terminated. The region A1b in the block B1b shown in FIG. 3B ensues.

An operation exerted by replacement will be described in conjunction with FIG. 4A to FIG. 5B. The object-of-wiring thinning cell WC1a (FIG. 4A) is replaced with the preferred-rule cell PC and then becomes an object-of-wiring thinning cell WC1b (FIG. 4B). The object-of-wiring thinning cell is expanded by two grids in the x direction. At this time, passing line channels PWC2 and PWC3 are newly created in the object-of-wiring thinning cell WC1b. Consequently, the wiring density of the wiring including lines 2W1b to 2W4b to the area of the object-of-wiring thinning cell WC1b is decreased and the congestion of the second wiring layer MET2 is alleviated. Since the spacing between adjoining ones of the lines 2W1b to 2W4b is enlarged, the wiring capacitance decreases. A signal delay can be prevented. The properties of a cell are improved.

Moreover, an object-of-wiring thinning cell WC2a (FIG. 5A) is replaced with a preferred-rule cell PC and has passing line channels newly created therein. Thereafter, the object-of-wiring thinning cell WC2a is reconnected to the other cells. Consequently, lines 4W1a and 4W2a (FIG. 5A) in the fourth wiring layer MET4 are transferred to be lines 2W5b and 2W6b (FIG. 5B) in the second wiring layer MET2. Consequently, the wiring density of the object-of-wiring thinning cell WC2b decreases because of an increase in the width thereof, and the congestion of wiring in the object-of-wiring thinning cell WC2b is alleviated. Moreover, since the wiring in the fourth wiring layer MET4 need not be used, the contacts CN1 and CN2 become unnecessary. Consequently, a contact resistance diminishes and a yield improves. Incidentally, the wiring density of the second wiring layer MET2 remains unchanged between before and after the replacement of a cell. Since bypasses to the fourth wiring layer MET4 are eliminated, the time required for automatic connection of the entire multilayer wiring is shortened.

An operation exerted by replacement will be described in conjunction with FIG. 1A and FIG. 1B. In the preferred-rule cell PC shown in FIG. 1B, a spacing between wirings or a spacing between a contact and a wiring shall be called a designing-rule spacing DRC that is a spacing determined as one of the rules for designing (thin arrow). Moreover, a spacing between the diffusion region 10 or 11 and the polysilicon wiring layer 12 shall be called a polysilicon-diffusion spacing PDC (thick arrow). When the minimum-rule cell MC (FIG. 1A) is replaced with the preferred-rule cell PC (FIG. 1B), the number of grids in the x direction increases by one grid, that is, four grids GRA are changed to five grids GRB. The designing-rule spacing DRC shown in FIG. 1A gets larger. This leads to improvement of a yield. Moreover, the polysilicon-diffusion spacing PDC also gets larger, a variation in the size of a transistor caused by diffusion regions can be suppressed. Consequently, a variation in the properties of a cell can be suppressed, and a yield can be improved.

As described above, according to a semiconductor integrated circuit designing method of the present embodiment, as shown in FIG. 4B and FIG. 5B, the number of contacts included in the object-of-wiring thinning cell WC and the number of bypasses included in the multilayer wiring are decreased. Consequently, the density of wiring is decreased and the congestion of wiring is alleviated. The time required for calculation employed in automatic connection is shortened, and the number of times by which connection is resumed is decreased. A total time required for the automatic arrangement and connection is shortened. Moreover, as shown in FIG. 1B and FIG. 4B, the object-of-wiring thinning cell WC has the rules for designing loosened. This leads to an increase in a manufacturing margin. Consequently, a yield improves. Moreover, since a spacing between wirings can be widened, in a wiring capacitance decreases and a signal transmission speed increases. This contributes to improvement of the properties of a cell.

Figure 6:
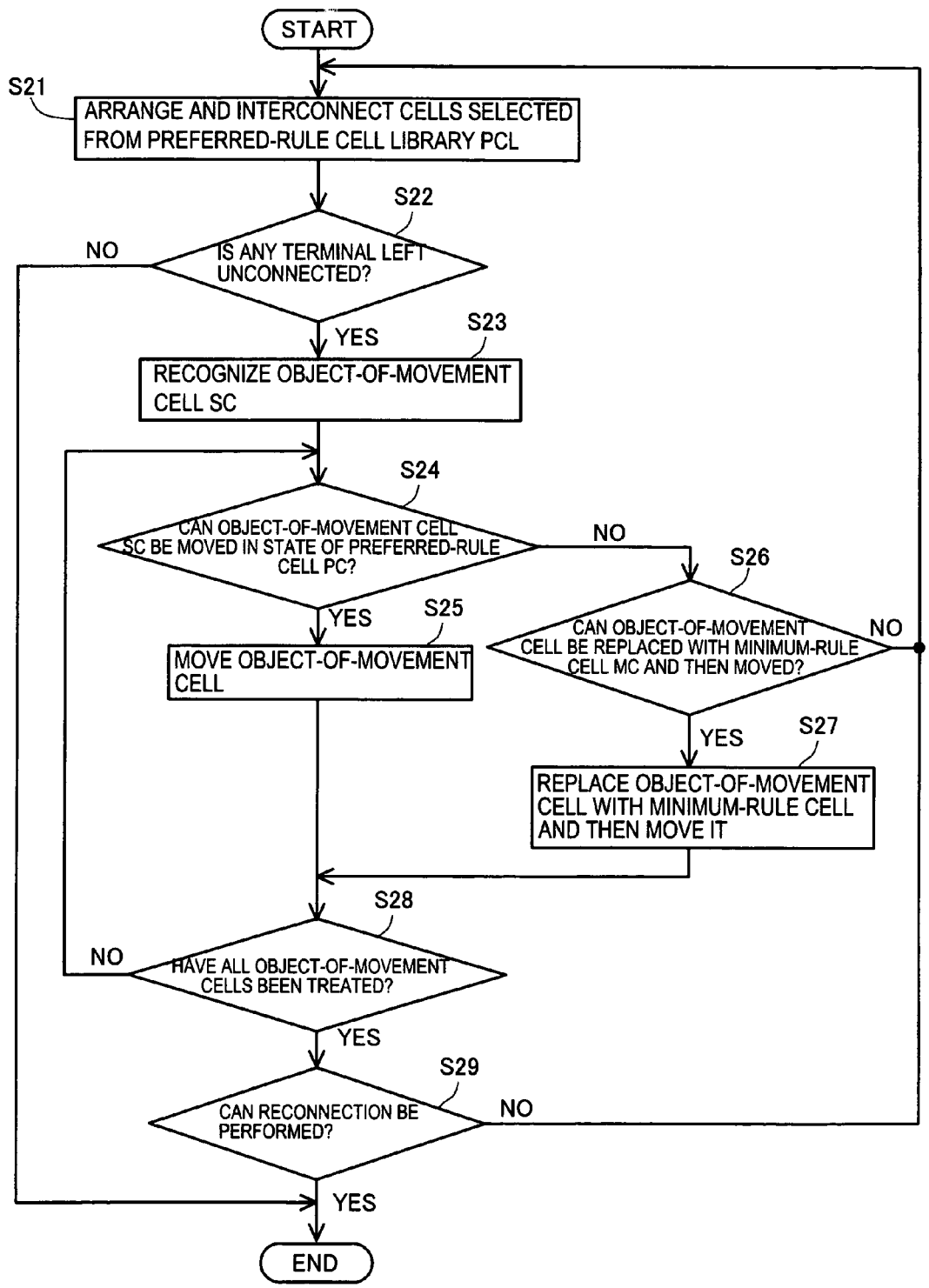
FIG. 6 is a flowchart describing a designing method in accordance with a second embodiment.
Figure 7A:
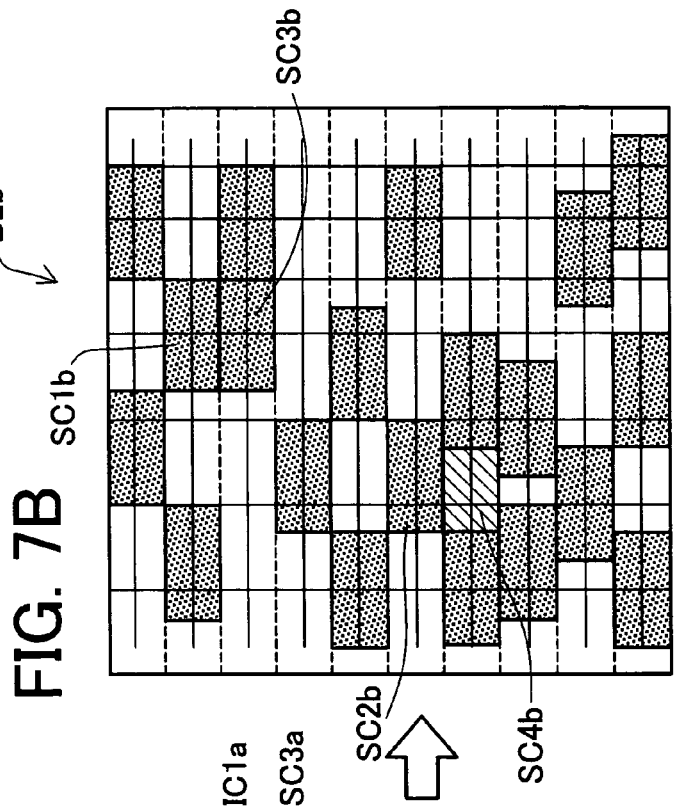
FIG. 7A and FIG. 7B schematically show a block treated according to the second embodiment.

A second embodiment will be described in conjunction with the flowchart of FIG. 6. The second embodiment maximizes the number of preferred-rule cells PC to such an extent that an unconnected state will not occur in a block during automatic connection. When automatic arrangement and connection is initiated, preferred-rule cells PC are selected from the preferred-rule cell library PCL according to a netlist, and arranged and interconnected within a block at step 21. FIG. 7A illustratively shows a block B2a observed immediately after the completion of arrangement and connection. A free region in the block B2a which is devoid of a cell is used effectively in order to arrange the preferred-rule cells PC on behalf of minimum-rule cells MC.

At step 22, each of the preferred-rule cells PC in the block B2a is checked to see whether it includes a terminal that is left unconnected. An unconnected state takes place because calculation does not converge within a predetermined time during automatic arrangement and connection during which reconnection is repeated while cells are moved. Moreover, a passing channel is unavailable between terminals that should be connected to each other, and bridged connection with wiring in an upper layer is impossible to do. When no terminal is left unconnected, control is passed to step 30 and processing is terminated. On the other hand, when a terminal is left unconnected, a cross is, as shown in FIG. 7A, drawn on the unconnected terminal. Control is then passed to step 23.

As shown in FIG. 7A, when minimum-rule cells MC are all replaced with preferred-rule cells PC, a terminal may be left unconnected. This is because during automatic arrangement and connection, calculation employed in arrangement and connection is converged by repeating reconnection while moving cells. However, as the ratio of preferred-rule cells to all cells increases, a cell use rate increases. Besides, the freedom in moving cells during automatic arrangement and connection decreases. Eventually, calculation hardly converges.

At step 23, a preferred-rule cell to be moved in order to eliminate an unconnected terminal is recognized as an object-of-movement cell SC. Methods for recognizing the object-of-movement cell SC include a method of recognizing a cell, which has a terminal left unconnected, as an object-of-movement cell SC and a method of recognizing as an object-of-movement cell SC at least one of cells through which a channel linking terminals that should be connected to each other passes at the shortest distance. Herein, a description will be made based on the method of recognizing as an object-of-movement cell SC a cell that includes an unconnected terminal. The block B2a (FIG. 7A) includes four cells (crossed cells) that have a terminal left unconnected. The cells are recognized as object-of-movement cells SC1a to SC4a.

Control is then passed to step 24. Each of the object-of-movement cells SC1a to SC4a is checked to see whether it can be moved in the state of a preferred-rule cell PC to be separated from an adjoining cell by a predetermined pitch. When the object-of-movement cell can be moved, control is passed to step 25. The object-of-movement cell is moved in the state of a preferred-rule cell PC. In contrast, when the object-of-movement cell is moved in the state of a preferred-rule cell PC, when it will not be separated from an adjoining cell by the predetermined pitch, control is passed to step S26.

At step 26, the object-of-movement cell SC that is a preferred-rule cell PC is checked to see whether after it is replaced with a minimum-rule cell MC, it can be moved to be separated from an adjoining cell by the predetermined pitch. At this time, after the preferred-rule cell MC is replaced with the minimum-rule cell MC, the cell is moved. Therefore, the freedom in moving the object-of-movement cell SC is improved, and the shortage of a destination space is prevented. Consequently, calculation employed in automatic arrangement and connection can be converged for a shorter period of time. Production of an unconnected terminal can be prevented. When the object-of-movement cell is verified to be able to be replaced with a minimum-rule cell MC and then moved, control is passed to step 27. The object-of-movement cell is then actually replaced with the minimum-rule cell MC and then moved. In contrast, when the object-of-movement cell is verified not to be able to be replaced with the minimum-rule cell MC and then moved, control is returned to step 21. Arrangement and connection is resumed.

At step 28, whether all the object-of-movement cells SC are checked at steps 24 and 26 is verified. When any object-of-movement cell SC has not been checked, control is returned to step 24. The same processing is repeated until an object-of-movement cell SC that has not been checked is not found any longer. When all the object-of-movement cells SC have been treated, control is passed to step 29, and reconnection is performed. When reconnection cannot be performed, control is returned to step 21. Arrangement and connection is resumed from the beginning. In contrast, when reconnection can be performed, control is passed to step 30. The processing is terminated. A block B2b shown in FIG. 7B ensues.

Figure 7B:
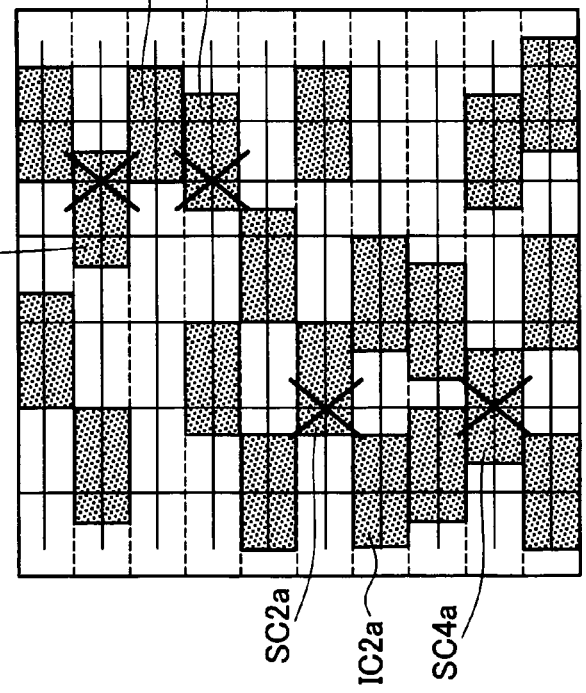
Figure 8:
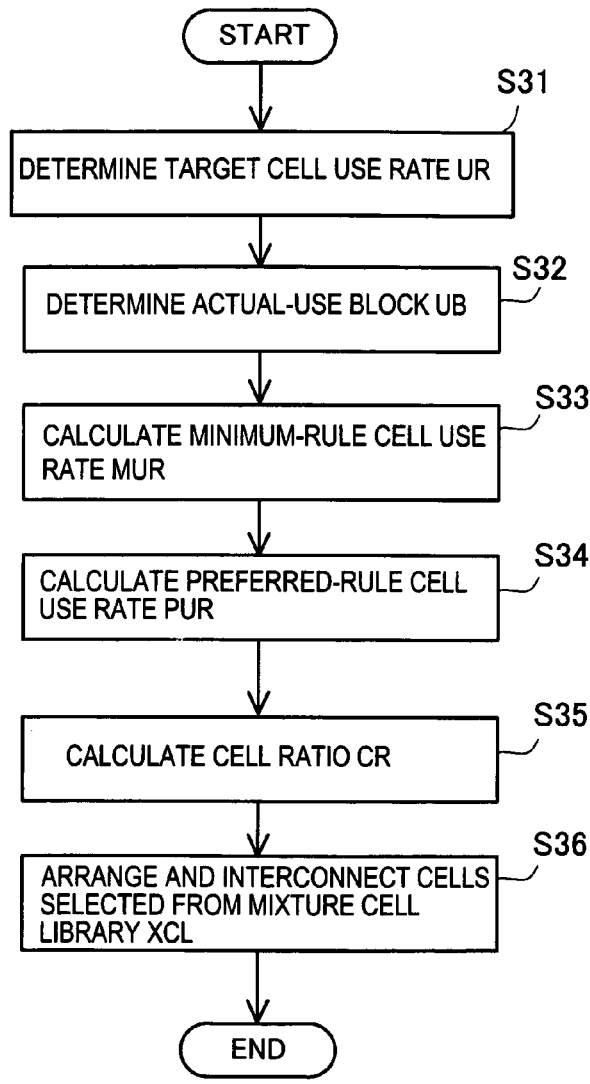
FIG. 8 is a flowchart describing a designing method in accordance with a third embodiment.
Figure 10:
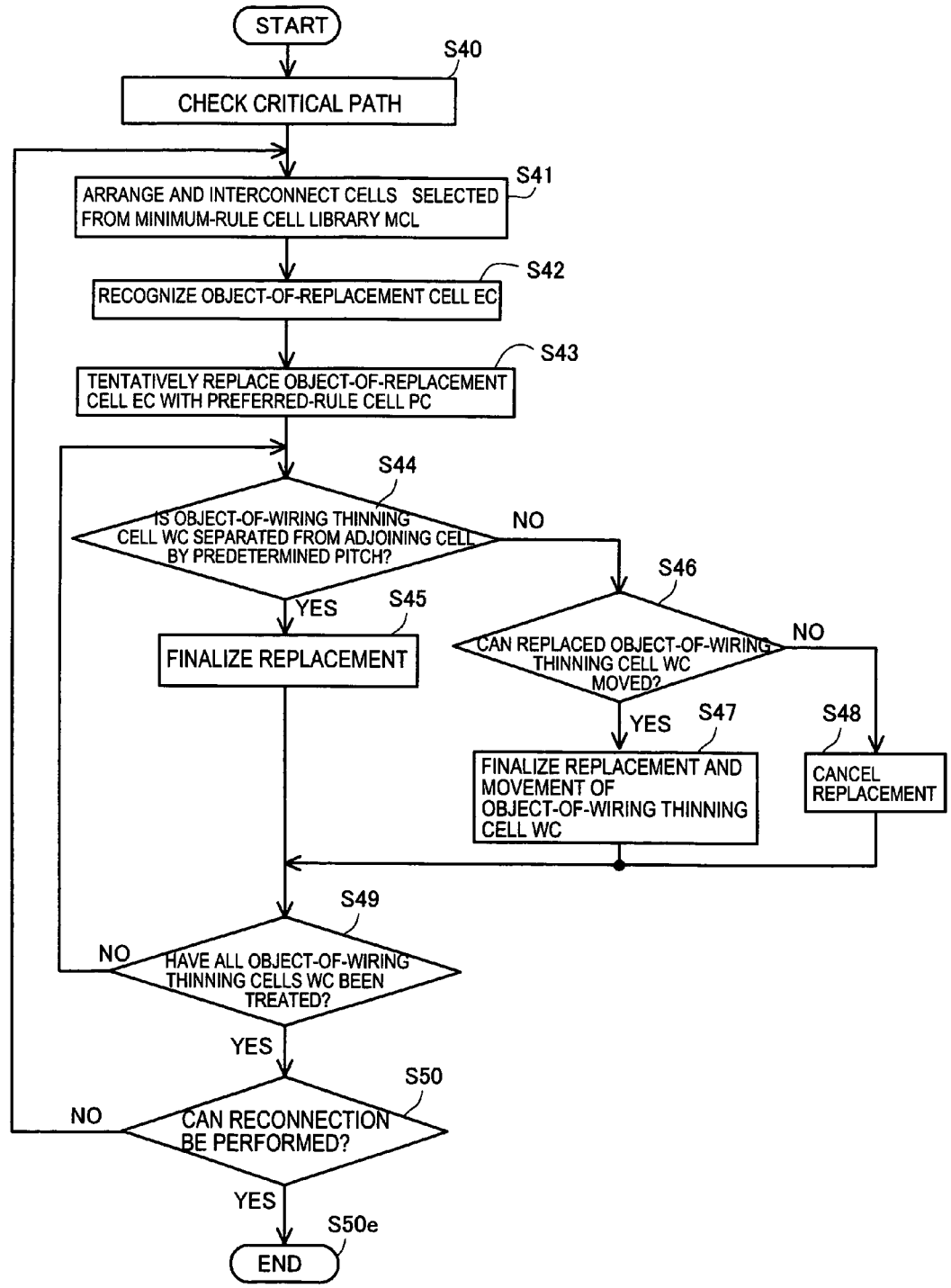
FIG. 10 is a flowchart describing a designing method in accordance with a fourth embodiment.

An operation exerted by replacement will be described in conjunction with FIG. 7A and FIG. 7B. Assume that terminals included in object-of-movement cells SC1a and SC3a (FIG. 7A) are terminals that should be connected to each other and that are held unconnected. There are few cells near the object-of-movement cells SC1a and SC3a, and spaces serving as destinations are reserved. The object-of-movement cells can be moved in the state of preferred-rule cells PC to be separated from the adjoining cells by the predetermined pitch (step 24). The object-of-movement cells are moved in the state of preferred-rule cells PC to approach each other, and then moved to a region in which wiring is not congested, whereby object-of-movement cells SC1b and SC3b shown in FIG. 7B ensue. Thus, a channel is reserved, and an unconnected state is resolved.

Moreover, assume that object-of-movement cells SC2a and SC4a (FIG. 7A) are terminals that should be connected to each other and that are held unconnected. Other cells are located near the object-of-movement cells SC2a and SC4a. When the object-of-movement cells are retained in the state of preferred-rule cells PC, it is hard to reserve a destination space. Therefore, the object-of-movement cell SC4a (preferred-rule cell PC) is replaced with a minimum-rule cell MC so that it will be changed to an object-of-movement cell SC4b, and then moved to the destination. Consequently, the object-of-movement cell is separated from the adjoining cell by the predetermined pitch (step 26). As shown in FIG. 7B, after the object-of-movement cell is replaced with the minimum-rule cell MC so that it will be changed to the object-of-movement cell SC4b, the object-of-movement cell is moved to approach the adjoining cell. Thus, an unconnected state is resolved.

A cell (cell IC1a or IC2a) located on a straight line linking terminals that are included in cells SC1a and SC3a or cells SC2a and SC4a respectively which are preferred-rule cells PC arranged in the block B2a, that should be connected to each other, and that are held unconnected may be defined as an obstacle cell. The obstacle cell may be regarded as an object-of-movement cell SC. The object-of-movement cell SC may then be moved to a free region devoid of a cell. Thus, a channel linking the cells SC1a and SC3a is reserved, and an unconnected state is resolved. Steps succeeding a step of recognizing an object-of-movement cell SC are identical to the steps 24 to 30 described in FIG. 6. The reiteration of the steps will therefore be omitted.

As described above, according to a semiconductor integrated circuit designing method of the second embodiment, when an unconnected state is caused by arranging preferred-rule cells PC, an object-of-movement cell SC is moved in the state of a preferred-rule cell PC or the object-of-movement cell SC is replaced with a minimum-rule cell MC and then moved. Thus, the unconnected state is resolved. Specifically, cells including terminals that should be connected to each other are moved to approach each other and then moved to a region in which wiring is not congested. Thus, a channel is reserved, and the unconnected state is resolved. Moreover, an obstacle cell that hinders connection of terminals that should be connected to each other is moved in order to reserve a channel. Thus, the unconnected state may be resolved. After a preferred-rule cell PC is moved, when it is not separated from an adjoining cell by a predetermined pitch, the preferred-rule cell is replaced with a minimum-rule cell MC. Thus, a cell area is decreased. Eventually, the cell is separated from the adjoining cell by the predetermined pitch.

As the ratio of the number of preferred-rule cells PC to the sum total of cells is increased, a cell use rate rises, and the freedom in moving cells diminishes. Consequently, automatic arrangement and connection hardly converges, and the number of unconnected terminals increases. Incidentally, as the ratio of the number of preferred-rule cells PC to the sum total of cells increases, since the preferred-rule cells have rules for designing loosened, the dispersion of transistors is reduced, and a yield is improved. Moreover, the number of bypasses included in multilayer wiring decreases, and a total time required for automatic arrangement and connection is shortened. According to the present embodiment, while production of an unconnected terminal is prevented, the ratio of the number of preferred-rule cells PC arranged in the block B2b can be maximized. Consequently, the improvement of a yield and the reduction in the total time required for automatic arrangement and connection can be maximized.

According to a third embodiment, both minimum-rule cells MC and preferred-rule cells PC are arranged and interconnected in order to realize a target cell use rate. The third embodiment will be described using the flowchart of FIG. 8. First, at step 31, a target cell use rate UR is calculated. An overall length of wiring is calculated based on a netlist. Thereafter, the size of a minimum block MB is calculated based on the overall length of wiring and the number of wiring layers predetermined with the cost of a chip. Moreover, the total area of the employed minimum-rule cells MC is calculated based on the netlist. Consequently, a target use rate UR, that is, the ratio of the total area of the minimum-rule cells MC to the area of the minimum block MB is calculated. The target cell use rate UR is a use rate attained in a case where the smallest cells are arranged at the highest wiring density in order to maximize the number of cells. The target cell user rate UR is the most ideal use rate in terms of reduction in a chip size. According to the present invention, the target cell use rate UR is set to 60%. A method of calculating the overall length of wiring and the size of a minimum block MB has been described in relation to the first embodiment, and the reiteration of the method will be omitted.

Thereafter, control is passed to step 32. The size of an actual-use block UB that is larger than the minimum block MB is determined. The larger the size of the actual-use block UB is, the more room wiring has. Calculation employed in automatic arrangement and connection is likely to converge. The size of the actual-use block UB is determined in consideration of the balance between the convergence of the calculation employed in automatic arrangement and connection and the cost of a chip. The method of determining the size has been described in relation to the first embodiment, and the reiteration of the method will be omitted.

Thereafter, control is passed to step 33. A minimum-rule cell use rate MUR, that is, a cell use rate of minimum-rule cells MC selected from the minimum-rule cell library MCL and arranged in the actual-use block UB according to a netlist is calculated. In this case, compared with the case where the target cell use rate UR is calculated, since a block size is increased, the minimum-rule cell use rate MUR is lower than the target cell use rate UR. According to the present embodiment, the minimum-rule cell use rate comes to 50%.

Thereafter, control is passed to step 34. A preferred-rule cell use rate PU, that is, a cell use rate of preferred-rule cells PC selected from the preferred-rule cell library PCL according to a netlist and arranged in the actual-use block UB is calculated. Compared with the case where the minimum-rule cell use rate MUR is calculated, since a cell size is increased, the preferred-rule cell use rate PUR is higher than the minimum-rule cell use rate MUR. According to the present embodiment, the preferred-rule cell use rate PUR comes to 70%.

When the minimum-rule cells MC are employed (the minimum-rule cell use rate MUR is 50%), the freedom in moving cells is high and calculation employed in automatic arrangement and connection is likely to converge. The ratio of a free region devoid of a cell is 50%. The free region devoid of a cell cannot be said to be effectively utilized. In contrast, when the preferred-rule cells PC are employed (preferred-rule cell use rate PUR is 70%), the free region devoid of a cell is effectively utilized. However, since the ratio of the free region devoid of a cell is 30%, the freedom in moving cells during calculation employed in automatic arrangement and connection is so low that the calculation may not converge. There is a fear that unconnected terminals may occur. In order to effectively utilize the free region devoid of a cell within the actual-use block UB while preventing occurrence of an unconnected state, the minimum-rule cells MC and preferred-rule cells PC should be mixed at an appropriate ratio and arranged. The ratio of the number of minimum-rule cells MC to the number of preferred-rule cells PC shall be defined as a cell ratio. The cell ratio is defined in various manners. According to the present embodiment, the ratio of the number of minimum-rule cells MC to the sum total of cells is defined as the cell ratio CR. Needless to say, the ratio of the number of minimum-rule cells MC to the number of preferred-rule cells PC will do. Moreover, a cell use rate of the mixture of the minimum-rule cells MC and preferred-rule cells PC shall be defined as a mixture cell use rate XUR.

Thereafter, control is passed to step 35, and the cell ratio CR is calculated. The cell ratio CR can be calculated optimally according to various methods. The method of calculating the cell ratio CR adopted in the present embodiment will be described on the assumption that an optimal value of the mixture cell use rate XUR (a value permitting automatic arrangement and connection to converge within a predetermined time and maximizing a use rate of preferred-rule cells PC) is equal to the target cell use rate UR (60%). The ratio of the number of employed minimum-rule cells PC to the sum total of arranged cells is the cell ratio CR. The ratio of the number of employed preferred-rule cells PC is provided as 1-CR. Moreover, the minimum-rule cell use rate MUR is 50%, and the preferred-rule cell use rate PUR is 70%. The use rates including the target cell use rate UR (60%) have a relationship expressed as follows:

$$50\ (\%) \times CR + 70\ (\%) \times (1 - CR) = 60\ (\%) \qquad (1)$$

The cell ratio CR=0.5 is provided by the formula (1). Consequently, when the minimum-rule cells MC and preferred-rule cells PC are mixed at the ratio of 50% respectively, the mixture cell use rate XUR becomes equal to the target cell use rate UR, that is, 60%.

Control is passed to step 36. A mixture cell library XCL containing minimum-rule cells MC at 50% and preferred-rule cells PC at 50% is created and used to perform arrangement and connection. As a result, as shown in FIG. 9, the minimum-rule cells MC and preferred-rule cells PC are arranged and interconnected at the ratio of 50% respectively.

As described above, according to a semiconductor integrated circuit designing method of the third embodiment, the freedom in moving cells is ensured, calculation employed in automatic arrangement and connection reliably converges, an unconnected state does not occur, and a free region devoid of a cell is utilized most effectively. A cell ratio can be optimized in order to maximize the number of preferred-rule cells PC. A target cell use rate UR is used as an index for optimizing the cell ratio, namely, the cell ratio is determined so that it will meet the target cell use rate UR. Thus, an optimal cell ratio can be determined quickly and readily. Since the cell ratio is optimized, while occurrence of an unconnected state is prevented, improvement of a yield attributable to the fact that the rules for designing are loosened because of the use of preferred-rule cells PC, and reduction in the total time required for automatic arrangement and connection can be maximized.

A fourth embodiment arranges preferred-rule cells PC as cells through which a critical path passes. The fourth embodiment will be described using the flowchart of FIG. 10. First, at step 40, based on a netlist listing circuit elements of a circuit equivalent to a semiconductor integrated circuit to be manufactured, a critical path CP that is a line whose margin is so small as to cause a signal delay and that requests a signal to be transmitted strictly according to a specific timing is produced. The critical path CP is realized with multilayer wiring. The critical path CP is produced based on the netlist. Otherwise, the critical path is produced because wiring is congested, a spacing between lines is narrowed, a wiring capacitance is increased, and a signal transmission speed is lowered. Otherwise, the critical path CP is produced based on the length of a channel.

At step 41, minimum-rule cells MC selected from the minimum-rule cell library MCL are arranged and interconnected. At step 42, a cell through even part of which a critical path CP that is a channel realized with multilayer wiring passes is regarded as an object-of-replacement cell EC. At steps 43 to 50e, the same processing as that employed in the first embodiment (steps 13 to 20e in FIG. 2) is performed. The details of the processing will be omitted. When all object-of-replacement cells EC have been treated, control is passed to step 50e. The processing is terminated. A block B4 shown in FIG. 11 ensues.

Figure 11:
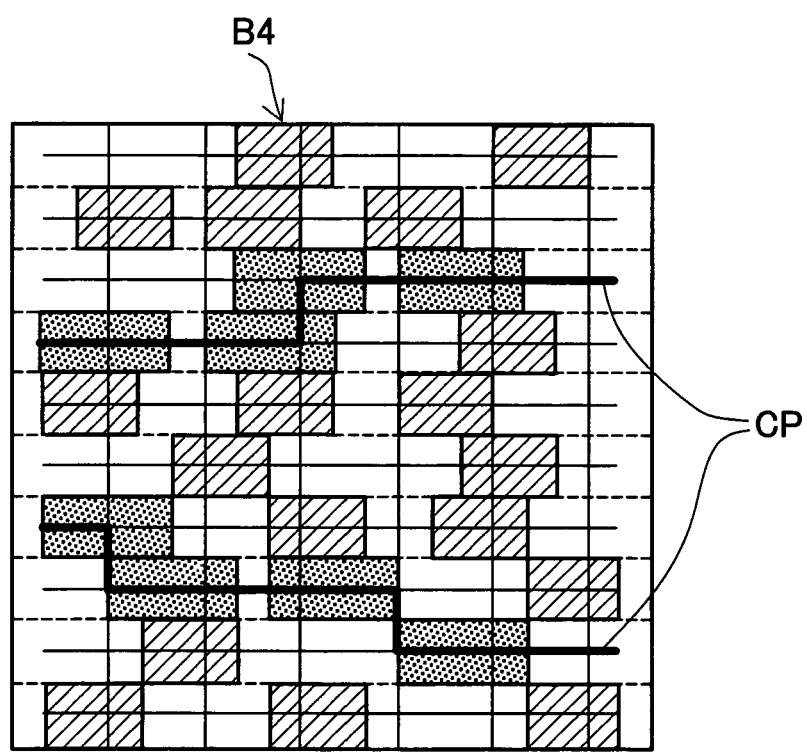
FIG. 11 schematically shows a block treated according to the fourth embodiment.
Figure 12:
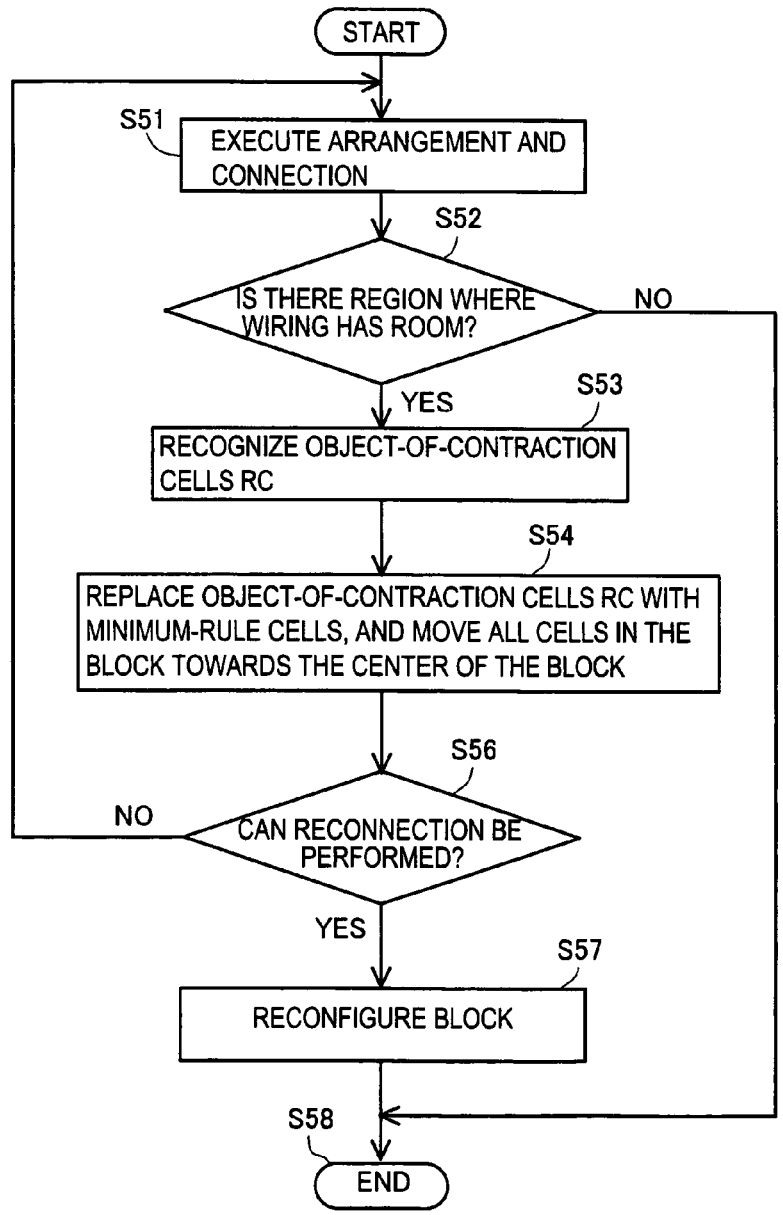
FIG. 12 is a flowchart describing a designing method in accordance with a fifth embodiment.
Figure 14A:
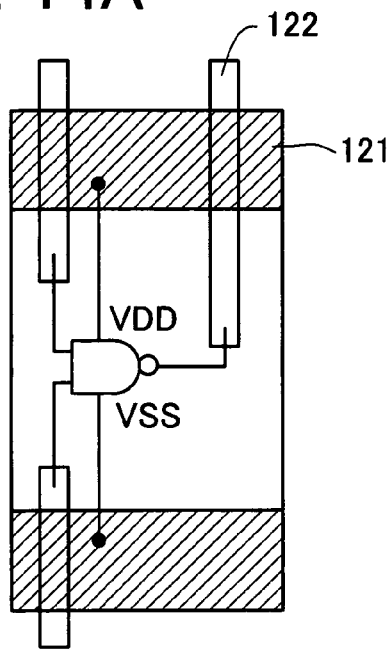
FIG. 14A shows an example of a standard cell employed according to a related art (part 1)
Figure 14B:
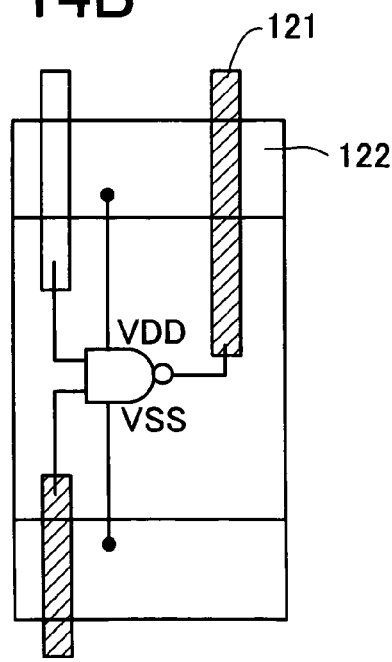
FIG. 14B shows an example of a standard cell employed according to the related art (part 2).

As shown in FIG. 11, cells through which the critical path CP (bold line in FIG. 11) passes are replaced with preferred-rule cells PC. Consequently, since the number of bypasses of the critical path CP decreases, a signal delay derived from a contact resistance can be prevented. Moreover, since the cells through which the critical path CP passes are replaced with the preferred-rule cells PC, a spacing between the critical path CP and any other line is expanded. Consequently, the wiring capacitance diminishes, and a signal delay is prevented. The critical path CP therefore exhibits a sufficient margin not causing a signal delay.

A fifth embodiment reduces a block size while improving a yield and shortening the time required for arrangement and connection. The fifth embodiment will be described using the flowchart of FIG. 12. First, at step 51, arrangement and connection is executed. The arrangement and connection is performed according to any of various methods. Similarly to the third embodiment, preferred-rule cells PC and minimum-rule cells MC may be mixed, arranged, and, interconnected, or only the preferred-rule cells PC may be arranged and interconnected. FIG. 13A illustratively shows a block B5a having preferred-rule cells PC alone arranged and interconnected therein and having no cell left unconnected.

At step 52, whether a region in which wiring has room is found is verified. Whether a region in which wiring has room is verified using a tool, for example, a congestion map. Whether wiring has room is determined according to various methods. For example, the ratio of an area occupied by wiring to the area of a preferred-rule cell PC, that is, a preferred-rule cell wiring density may be calculated. When the preferred-rule cell wiring density is equal to or smaller than a value predetermined according to a process technology or the specifications for a semiconductor integrated circuit, the wiring is verified to have room. At step 52, when the preferred-rule cell wiring density is equal to or larger than the predetermined value, the wiring is verified to be congested and have no room. Control is then passed to step 58, and the processing is terminated. When the preferred-rule cell wiring density is smaller than the predetermined value, the wiring is verified to have room. Control is passed to step 53. All the preferred-rule cells PC in a region A2 of a block B5a are regarded as cells whose wirings have room.

At step 53, among the cells whose wirings have room, preferred-rule cells PC are recognized as object-of-contraction cells RC. Since the cells in the region A2 of the block B5a are all preferred-rule cells PC, the preferred-rule cells PC are recognized as the object-of-contraction cells RC.

Thereafter, control is passed to step 54. All of the recognized object-of-contraction cells RC (preferred-rule cells PC) are replaced with minimum-rule cells MC. Thereafter, all the cells included in the block B5a (both the minimum-rule cells MC and preferred-rule cells PC) are moved towards the center PP of the block B5a in order to fill a free region that is devoid of a cell and that results from the replacement. At step 56, whether reconnection can be performed is verified. When reconnection cannot be performed, control is returned to step 51 and arrangement and connection is resumed. In contrast, when reconnection can be performed, control is passed to step 57. The block is reconfigured. Processing is then terminated at step 58. Consequently, a block B5b produced by reducing the size of the block B5a ensues as shown in FIG. 13B. Even when the object-of-contraction cells RC (preferred-rule cells PC) are replaced with minimum-rule cells MC, a value should preferably be predetermined in order to check whether the wirings of the minimum-rule cells have room. At this time, the value should be determined in order to ensure a sufficient margin that does not extend the time required for automatic arrangement and connection or does not degrade a yield.

As described above, according to a semiconductor integrated circuit designing method of the fifth embodiment, preferred-rule cells PC arranged in a region whose wiring density is smaller than a predetermined value and whose wiring is thought to have room are replaced with minimum-rule cells MC. The replaced cells and other cells are moved towards the center of a block in order to utilize a free space resulting from the replacement. After the movement is completed, reconnection is performed and the block is reconfigured. Thus, preferred-rule cells PC whose wirings have room can be selectively replaced with minimum-rule cells MC. At this time, congestion of wiring derived from replacement with a minimum-rule cell MC can be prevented. Degradation of a yield derived from an increase in the time required for automatic arrangement and connection and an increase in the number of bypasses can be prevented. Moreover, a block size can be reduced. While the performance of a semiconductor device is maintained and the time required for automatic arrangement and connection is retained at an appropriate time, a chip size can be reduced. Eventually, the cost of a semiconductor device can be lowered.

The present invention is not limited to the aforesaid embodiments. Needless to say, the present invention can be modified or varied in various manners without a departure from the gist of the present invention. According to the third embodiment, minimum-rule cells MC and preferred-rule cells PC are mixed, arranged, and interconnected in order to attain a target cell use rate UR. When arrangement and connection is completed according to the third embodiment (FIG. 9), the other embodiments may be introduced.

For example, the processing employed in the first or second embodiment may be adapted to the block B3 shown in FIG. 9 and produced by performing arrangement and connection according to the third embodiment. When congested wiring is produced, the congestion of the congested wiring is alleviated according to the processing employed in the first embodiment. Namely, the wiring density of each of minimum-rule cells MC in the block is calculated. A minimum-rule cell whose wiring density is larger than a predetermined value is regarded as an object-of-wiring thinning cell WC. The succeeding steps are identical to steps 14 to 20*e* described in FIG. 2, and the reiteration of the steps will be omitted. When an unconnected cell is produced, the unconnected state is resolved according to the processing employed in the second embodiment. A preferred-rule cell PC that is included in the block and has a terminal left unconnected, or at least one of cells located on a straight line linking terminals that should be connected to each other (defined as an obstacle cell) is regarded as an object-of-movement cell SC. The succeeding steps are identical to steps 24 to 30 described in FIG. 6, and the reiteration of the steps will be omitted. Thus, a cell use rate is improved by effectively utilizing a free region devoid of a cell, and occurrence of an unconnected state is prevented. This leads to improvement of a yield and improvement of the properties of a cell. In addition, since congested wiring is eliminated, the time required for automatic arrangement and connection can be shortened and the properties of a cell can be improved because of reduction in a wiring capacitance.

For example, the processing employed in the fifth and second embodiments may be adapted to the block B3 shown in FIG. 9 and produced by completing arrangement and connection according to the third embodiment. When the block has a region whose wiring has room, the block size can be reduced according to the fifth embodiment. Namely, preferred-rule cells PC located in the region of the block whose wiring has room are regarded as object-of-contraction cells RC. The succeeding steps are identical to steps 54 to 58 described in FIG. 12, and the reiteration of the steps will be omitted. When an unconnected cell is produced, the unconnected state is resolved according to the processing employed in the second embodiment. Namely, a preferred-rule cell PC that is included in the block and has a terminal left unconnected or at least one of cells located on a straight line linking terminals that should be connected to each other (defined as an obstacle cell) is regarded as an object-of-movement cell SC. The succeeding steps are identical to steps 24 to 30 described in FIG. 6, and the reiteration of the steps will be omitted. Thus, occurrence of an unconnected state is prevented, a yield is improved, and the time required for arrangement and connection is shortened. Moreover, a block size is reduced. This contributes to reduction in the cost of a chip.

For example, the processing employed in the second embodiment may be adapted to the block B5*b*, which is shown in FIG. 13B and produced by completing arrangement and connection according to the fifth embodiment, in case the block B5*b* includes an unconnected cell. Namely, a preferred-rule cell PC that is included in the block B5*b* and has a terminal left unconnected or at least one of cells located on a straight line linking terminals that should be connected to each other (defined as an obstacle cell) is regarded as an object-of-movement cell SC. The succeeding steps are identical to steps 24 to 30 described in FIG. 6, and the reiteration of the steps will be omitted. Consequently, occurrence of an unconnected state is prevented and a block size is reduced. Eventually, a yield is improved and the time required for arrangement and connection is shortened. This contributes to reduction in the cost of a chip.

According to the processing employed in the fourth embodiment, after arrangement and connection (step 41 in FIG. 10) is executed, an object-of-replacement cell EC through which a critical path CP passes is identified (step 42). The present invention is not limited to this mode. Before arrangement and connection is executed (step 41), the critical path CP may be checked based on a netlist, and a cell through which the critical path CP passes may be realized with a preferred-rule cell PC.

According to the processing employed in the first embodiment, a wiring density is calculated. When the wiring density is equal to or larger than a predetermined value, wiring is verified to be congested. The method of verifying whether wiring is congested is not limited to this method. For example, when the ratio of the number of lines passing through a cell to the number of channels provided by the cell is equal to or larger than a predetermined value, wiring may be verified to be congested.

According to the processing employed in the fifth embodiment, preferred-rule cells PC located in a region whose wiring has room are regarded as object-of-contraction cells RC. Alternatively, when preferred-rule cells PC located on the border of the block B5*a* (FIG. 13A) are regarded as object-of-contraction cells RC, since only the cells on the border are moved towards the center of the block, the number of cells to be moved is small. This is preferable.

The minimum-rule cell library MCL is an example of a first cell library, and the preferred-rule cell library PCL is an example of a second cell library. The minimum-rule cell MC is an example of a first cell, and the preferred-rule cell PC is an example of a second cell. The preferred-rule cell wiring density is an example of a second cell wiring density.

According to the present invention, when a semiconductor integrated circuit is designed, the number of bypasses or contacts included in multilayer wiring is decreased in order to alleviate congestion of wiring. Consequently, the time required for calculation employed in automatic arrangement and connection is shortened and the number of times by which arrangement and connection is resumed is decreased. The total time required for automatic arrangement and connection can be shortened. Moreover, since the rules for designing can be loosened, the dispersion of transistors can be minimized. Consequently, a manufacturing margin increases, and a yield improves. Moreover, since a spacing between lines is widened, a wiring capacitance diminishes. Eventually, a signal transmission speed improves. This contributes to improvement of the properties of a cell.

What is claimed is:

1. A semiconductor integrated circuit designing method employing:
    a first cell library that contains a plurality of standard cells, and;
    a second cell library that contains cells which, unlike the cells that are contained in the first cell library and share the same circuitry, include numerous channels and have rules for designing loosened;
    the designing method comprising the steps of:
    arranging and interconnecting cells selected from the first cell library;
    calculating a wiring density, which is, a ratio of an area occupied by wiring to an area of each of first cells that are selected from the first cell library and arranged and interconnected, and recognizing a first cell as an object-of-wiring thinning cell according to the wiring density;
    replacing the object-of-wiring thinning cell with a second cell, which is selected from the second cell library, so that the object-of-wiring thinning cell will be separated from an adjoining cell by a predetermined pitch; and
    performing reconnection.

2. The semiconductor integrated circuit designing method according to claim 1, wherein after the step of replacing a first cell with a second cell is completed, when the object-of-wiring thinning cell is not separated from the adjoining cell by the predetermined pitch, the replaced object-of-wiring thinning cell is moved.

3. A computer readable medium, having embedded thereon a computer program for designing a semiconductor integrated circuit, when executed by a computer causes the computer to employ:
    a first cell library that contains a plurality of standard cells; and
    a second cell library that contains cells which, unlike the cells that are contained in the first cell library and share the same circuitry, include numerous channels and have rules for designing loosened;
    the program performing the steps of:
    arranging and interconnecting cells selected from the first cell library;
    calculating a wiring density, which is, a ratio of an area occupied by wiring to an area of each of first cells selected from the first cell library and arranged and interconnected, and recognizing a first cell as an object-of-wiring thinning cell according to the wiring density;
    replacing the object-of-wiring thinning cell with a second cell selected from the second cell library so that the object-of-wiring thinning cell will be separated from an adjoining cell by a predetermined pitch; and
    performing reconnection.

* * * * *